United States Patent
Rhee

(10) Patent No.: US 11,050,962 B2
(45) Date of Patent: Jun. 29, 2021

(54) DUAL MODE FOCAL PLANE ARRAY HAVING DI AND BDI MODES

(71) Applicant: Raytheon Company, Waltham, MA (US)

(72) Inventor: Jehyuk Rhee, Newbury Park, CA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 16/040,777

(22) Filed: Jul. 20, 2018

(65) Prior Publication Data
US 2020/0029041 A1     Jan. 23, 2020

(51) Int. Cl.
| H04N 5/3745 | (2011.01) |
| H04N 5/33 | (2006.01) |
| H04N 5/378 | (2011.01) |
| H04N 5/355 | (2011.01) |
| H01L 27/146 | (2006.01) |

(52) U.S. Cl.
CPC ..... *H04N 5/3745* (2013.01); *H01L 27/14609* (2013.01); *H01L 27/14649* (2013.01); *H04N 5/33* (2013.01); *H04N 5/35527* (2013.01); *H04N 5/378* (2013.01)

(58) Field of Classification Search
CPC ........ H04N 5/378; H04N 5/33; H04N 5/3745; H04N 5/37457; H04N 5/35527; H01L 27/14609; H01L 27/14649
See application file for complete search history.

(56) References Cited

U.S. PATENT DOCUMENTS

| 5,481,104 A | 1/1996 | Miller et al. |
| 6,373,050 B1 | 4/2002 | Pain et al. |
| 8,878,595 B2 | 11/2014 | Sun et al. |
| 2012/0248288 A1 | 10/2012 | Linder et al. |
| 2014/0197878 A1* | 7/2014 | Sun ........................ H03K 17/00 327/434 |

(Continued)

FOREIGN PATENT DOCUMENTS

| CN | 101009762 A | 8/2007 |
| WO | WO 2004/074789 A1 | 9/2004 |
| WO | WO 2014/086430 A1 | 6/2014 |

OTHER PUBLICATIONS

Sun et al. "A buffer direct injection and direct injection readout circuit with mode selection design for infrared focal plane arrays", Infrared Physics & Technology, 63, year 2014, p. 140-146.*

(Continued)

*Primary Examiner* — Jennifer D Bennett
(74) *Attorney, Agent, or Firm* — Daly, Crowley Mofford & Durkee, LLP

(57) ABSTRACT

A dual mode focal plane array having a readout integrated circuit (IC) is provided herein that is electrically switchable between a first mode (e.g., direction injection mode) and a second mode (e.g., buffered direction injection) based in part on a level of a detection current. The IC includes a switching network disposed between an operational amplifier and a switching element to transition the IC between the first and second mode responsive to a control signal. The control signal can include instructions to open or close the one or more switches of the switching network and thus transition the IC between the different modes.

13 Claims, 11 Drawing Sheets

(56) References Cited

U.S. PATENT DOCUMENTS

2015/0153231 A1 6/2015 Sun et al.
2015/0319391 A1* 11/2015 Yazici .............. H01L 27/14609
   348/300
2016/0057366 A1 2/2016 Lee et al.

OTHER PUBLICATIONS

Sun et al., "Readout Integrated Circuit with Dual Mode Design for Infrared Focal Plane Array Photo-detector," Photonics Global Conference (PGC) 2012; Dec. 13-16, 2012; 4 Pages.
Woo et al., "Novel Current-Mode Background Suppression for 2-D LWIR Applications;" IEEE Transactions on Circuits and Systems—II; vol. 52, No. 9; Sep. 2005; 5 Pages.
PCT International Search Report and Written Opinion dated Aug. 12, 2019 for International Application No. PCT/US2019/032143; 13 Pages.
PCT International Search Report and Written Opinion dated Aug. 12, 2019 for International Application No. PCT/US2019/032141; 15 Pages.
U.S. Appl. No. 16/040,780, filed Jul. 20, 2018, Rhee, et al.
Taiwan Allowance Decision (with English Translation) dated Jun. 18, 2020 for Taiwan Application No. 108118210; 3 Pages.
Taiwan Office Action (with English Translation) dated Feb. 15, 2020 for Taiwan Application No. 108118210; 16 Pages.
Response (with Machine English Translation & Amended Claims) to Taiwan Office Action dated Feb. 15, 2020 for Taiwan Application No. 108118210; Response filed Apr. 9, 2020; 11 Pages.
U.S. Non-Final Office Action dated Apr. 10, 2020 for U.S. Appl. No. 16/040,780; 9 Pages.
Response to U.S. Non-Final Office Action dated Apr. 10, 2020 for U.S. Appl. No. 16/040,780; Response filed Jul. 6, 2020; 9 Pages.
Taiwan Office Action (with English Translation) dated Dec. 7, 2020 for Taiwan Application No. 108118212; 20 Pages.
U.S. Notice of Allowance dated Oct. 29, 2020 for U.S. Appl. No. 16/040,780; 8 Pages.
PCT International Preliminary Report dated Feb. 4, 2021 for International Application No. PCT/US2019/032143; 8 Pages.
PCT International Preliminary Report dated Feb. 4, 2021 for International Application No. PCT/US2019/032141; 10 Pages.
Response (with English Translation & Amended Claims) to Taiwan Office Action dated Dec. 7, 2020 for Taiwan Application No. 108118212; Response filed Mar. 5, 2021; 16 Pages.
Israeli Notice of Allowance (with Allowed Claims in English) dated Mar. 10, 2021 for Israeli Patent Application No. 280042; 9 Pages.

* cited by examiner

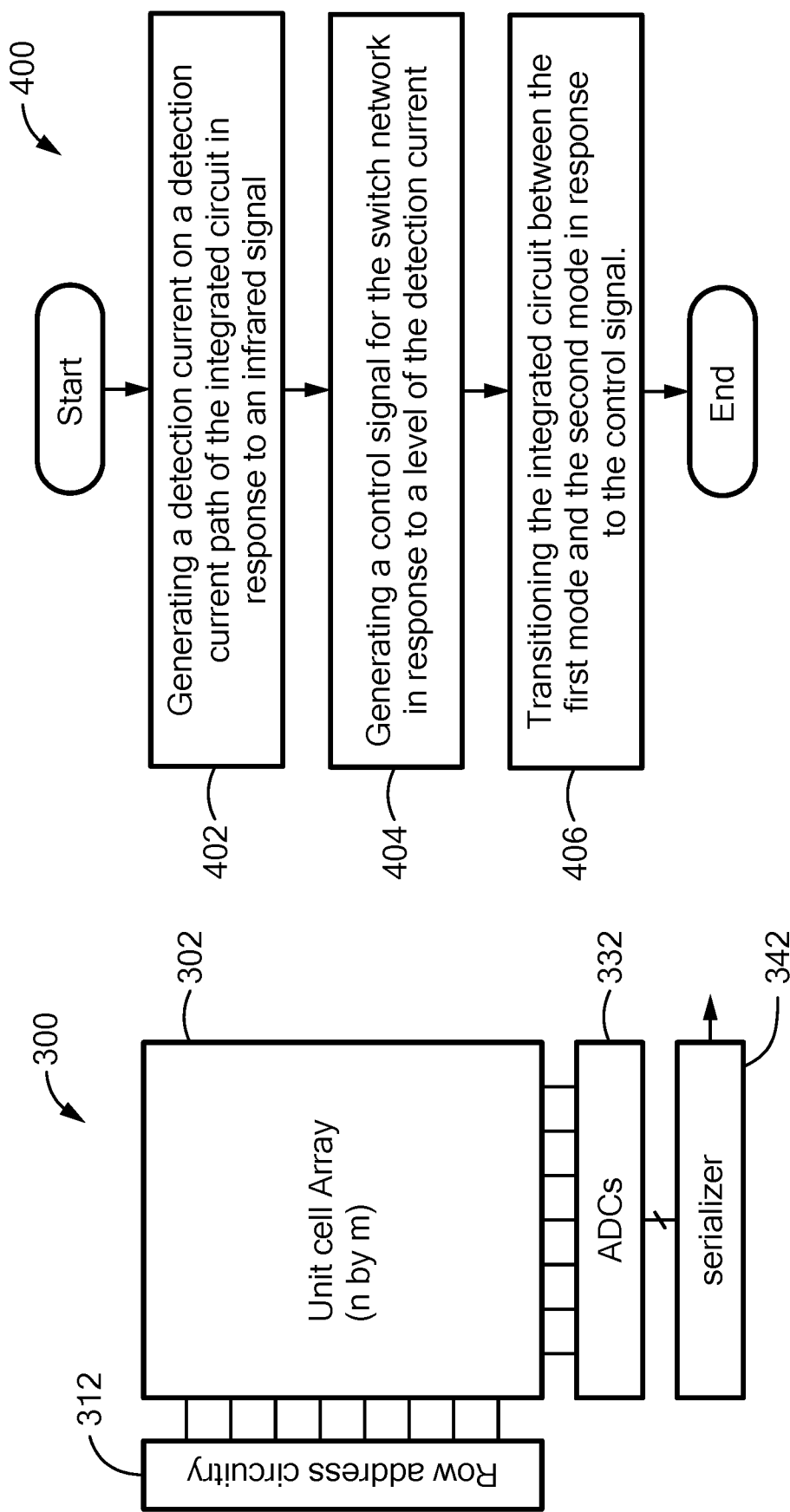

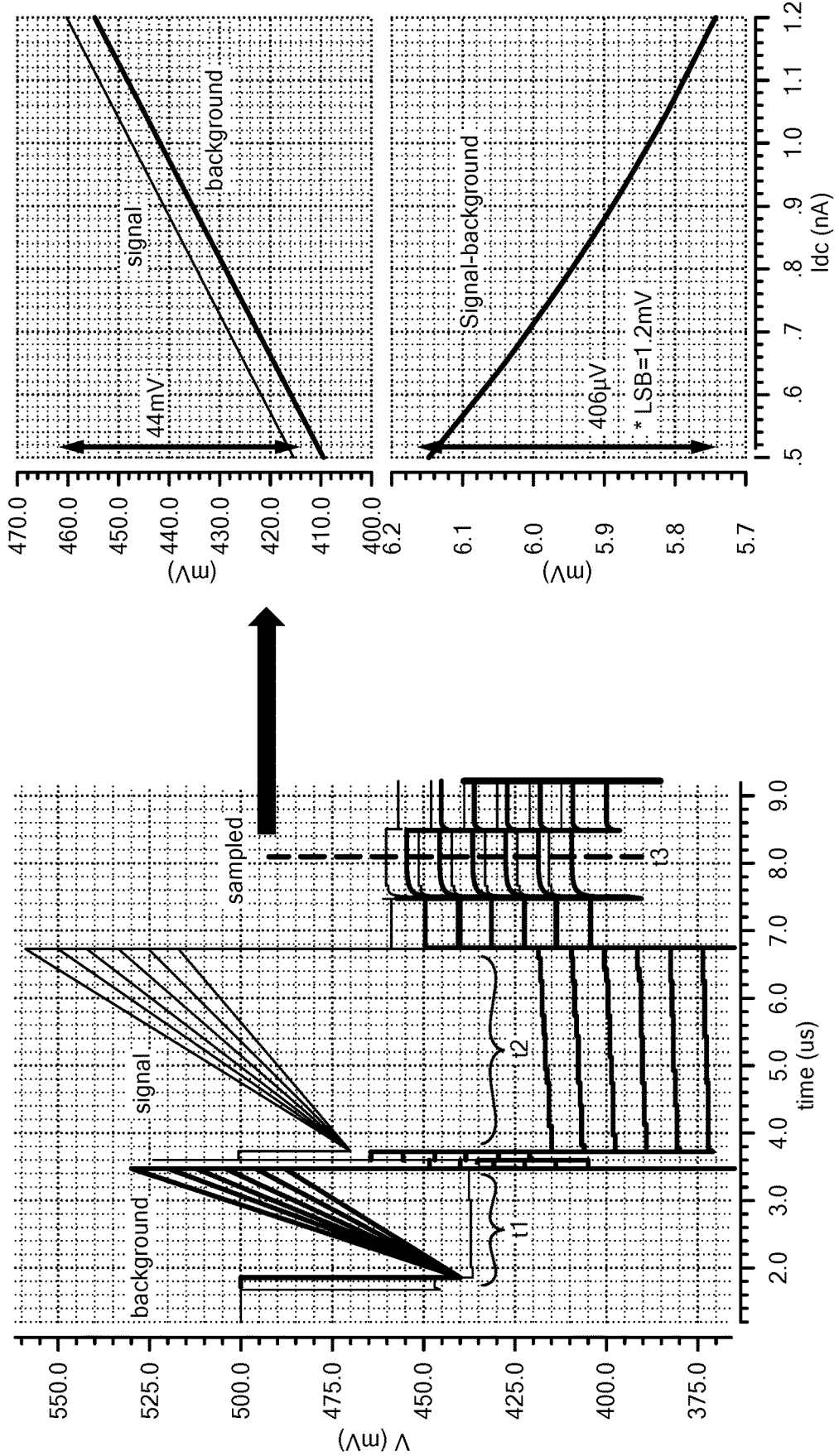

DUAL MODE FOCAL PLANE ARRAY HAVING DI AND BDI MODES

BACKGROUND

As is known in the art, a focal plane array is an image sensing device typically having an array of pixels at the focal plane of the lens of the image sensing device. Focal plane arrays have been used in a variety of different applications including sensors, infrared astronomy, manufacturing inspection, thermal imaging for firefighting, medical imaging, and infrared phenomenology.

Focal plane arrays include circuitry to convert light signals received at the array into electrical signals. However, light signals having different strengths or other properties can be difficult to process. Therefore, focal plane arrays typically include multiple circuits having complex designs to properly receive and process light signals at a variety of different strengths.

SUMMARY

In accordance with the concepts, systems, methods and techniques described herein a dual mode focal plane array having a readout integrated circuit (IC) is provided. The readout IC is configured to transition between direct injection (DI) mode and buffered direction injection (BDI) mode in response to a level of a detection current. Thus, the ICs described herein provide the operability of both DI mode and BDI mode within a shared architecture.

For example, DI and BDI circuits, as described herein, can provide a large full well that is determined by an integration capacitor within the respective circuit. The DI circuits can be configured to receive and process stronger light signals (e.g., infrared (IR) signals, laser pulses, etc.). BDI circuits can provide a lower input impedance, faster response times and be configured to receive and process weaker light signals. Thus, the ICs described herein can transition between DI mode and BDI mode based at least in part on the properties of the signals being received at the respective array.

The mode of operation (e.g., DI or BDI) can be set in response to a control signal generated by a user. In some embodiments, the IC can be transitioned between DI mode and BDI mode using control signals generated by a user. The control signal can be generated in response to a level of the detection current and the detection current can be generated responsive to an IR signal received at the focal plane array. The readout IC can operate in DI mode for stronger laser pulses resulting in a high detection current (e.g., detection current greater than a current threshold) and the readout IC can operate in BDI mode for weaker laser pulses resulting in a low detection current (e.g., detection current lower than or equal to a current threshold).

In DI mode, an amplifier in the readout IC can serve as a shield for a sensitive common DI bias to mitigate or prevent electrical crosstalk. For example, in DI mode, a detector bias control signal, vUcDet, can be coupled to a gate terminal of an input device and shared with each unit cell in the respective array. This may cause crosstalk issue for laser spot tracker type applications because a drain voltage of the input device could increase quickly in response to a received laser pulse and be coupled to the detector bias control signal, vUcDet, through a gate drain capacitor, Cgd, of the input device. Therefore, the DI circuits as described herein include an operational amplifier that is configured to operate as a unity gain buffer in order to serve as shield for the detector bias control signal, vUcDet, to prevent crosstalk.

In an embodiment, the dual mode focal plane array having the readout IC can be used for a variety of different applications, including but not limited to, a laser spot tracker system that can be configured to output a laser spot position at a very fast frame rate (e.g., several tens of kilo frame per second). For example, the dual mode focal plane array can include a plurality of pixels and be configured to detect properties of one or more IR signals received at the array and generate an electrical signal corresponding to those properties (e.g., an electrical charge, voltage, or resistance in relation to the number of photons detected at each pixel of the array). The electrical signal can be measured, digitized and then further processed to construct an image of an object, scene, or phenomenon corresponding to the IR signal received at the array.

The systems and methods described herein may include one or more of the following features independently or in combination with another feature.

In a first aspect, an integrated circuit (IC) is provided comprising an operational amplifier having a first input and a second input, wherein the second input is coupled to a feedback signal path and a switching network having a first switch and second switch. The first switch is coupled between the output of the operational amplifier and the feedback signal path and the second switch is coupled between a detection signal path and the feedback signal path. The switching network is configured to switch the integrated circuit between a first mode and a second mode responsive to a level of a detection current generated on the detection signal path. The IC further comprises an input device having a first terminal coupled to an output of the operational amplifier, a second terminal coupled to the detection signal path to receive the detection current, and a third terminal.

The second terminal of the input device can be coupled to the second input of the operational amplifier through the second switch. The first mode comprises a direct injection (DI) mode and the second mode comprises a buffered direct injection (BDI) mode. During DI mode, the first switch can be closed and the second switch can be open such that the output of the operational amplifier is coupled to the second input of the operational amplifier, and during BDI mode, the first switch can be open and the second switch can be closed such that the second terminal of the input device is coupled to the second input of the operational amplifier.

The switching network can transition the integrated circuit to the first mode when the level of the detection current is greater than a current threshold and transitions the integrated circuit to the second mode when the level of the detection current is less than or equal to the current threshold, for example, in response to a control signal generated by a user.

The first input of the operation amplifier is configured to receive a detection bias voltage signal (vUcDet).

In some embodiments, the IC comprises a sample and hold module having a sample and hold switch and a capacitor. The sample and hold switch has a first terminal coupled to the third terminal of the input device and a second terminal coupled to a first terminal of the capacitor, and the capacitor has a second terminal coupled to a reference potential. A reset switch can be provided having a first terminal coupled to the third terminal of the input device and a second terminal coupled to a reference potential.

The IC can comprise a read out integrated circuit configured to receive a signal from a focal plane array.

In some embodiments, the IC comprises a source follower and a row select switch. The source follower can include a first terminal coupled to the third terminal of the input device, a second terminal coupled to a reference voltage and a third terminal coupled to a first terminal of the row select switch. The row select switch can have a second terminal coupled to a focal plane array, and the row select switch can be configured to selectively read data from one of a plurality of rows of the focal plane array.

A photodiode can be coupled to the second terminal of the input device. The photodiode can be configured to detect an infrared signal and generate the detector current responsive the infrared signal.

In another aspect, a method for transitioning an integrated circuit between a first mode and a second mode is provided. The method includes generating a detection current on a detection signal path of the integrated circuit in response to an infrared signal. The integrated circuit includes an operational amplifier having a first input and a second input, the second input is coupled to a feedback signal path, a switching network having a first switch and a second switch, the first switch is coupled between an output of the operational amplifier and the feedback signal path and the second switch is coupled between the detection signal path and the feedback signal path, and a input device having a first terminal coupled to an output of the operational amplifier, a second terminal coupled to the detection signal path to receive the detection current, and a third terminal.

The method further comprises generating a control signal for the switching network in response to a level of the detection current and transitioning the integrated circuit between the first mode and the second mode in response to the control signal. In some embodiments, the control signal can be generated by a user.

The first mode can comprise a direct injection (DI) mode and the second mode can comprise a buffered direct injection (BDI) mode. During DI mode, the method includes closing the first switch and opening the second switch such that the output of the operational amplifier is coupled to the second input of the operational amplifier. During BDI mode, the method includes opening the first switch and closing the second switch such that the second terminal of the input device is coupled to the second input of the operational amplifier.

The integrated circuit can be transitioned to the first mode when the level of the detection current is greater than the current threshold and transitioning the integrated circuit to the second mode when the level of the detection current is less than or equal to the current threshold.

The operational amplifier can include an operational amplifier, and the first input of the operation amplifier can be configured to receive a detection bias voltage signal. A sample and hold module can be provided having a sample and hold switch and a capacitor. The sample and hold switch can have a first terminal coupled to the third terminal of the input device and a second terminal coupled to a first terminal of the capacitor, and the capacitor can have a second terminal coupled to a reference potential.

A reset switch can be provided having a first terminal coupled to the third terminal of the input device and a second terminal coupled to a reference potential.

The IC can comprise a read out integrated circuit configured to receive a signal from a focal plane array. The IC may include a source follower and a row select switch. The source follower can include a first terminal coupled to the third terminal of the input device, a second terminal coupled to a reference voltage and a third terminal coupled to a first terminal of the row select switch. The row select switch can have a second terminal coupled to a focal plane array, and the row select switch can be configured to selectively read data from one of a plurality of rows of the focal plane array.

In another aspect, a system comprises: a background module including a first capacitor to integrate a first signal for a first amount of time, wherein the first signal comprises a background signal; and a signal module including a second capacitor to integrate a second signal for a second amount of time, wherein the second signal comprises a signal of interest and the background signal, wherein the first and second capacitors have impedance values in a first ratio, and wherein the first amount of time and the second amount of time define a second ratio corresponding to the first ratio.

A system can further include one or more of the following features: a controller module to subtract the first signal from the second signal to obtain a signal corresponding to a laser spot tracking signal, the controller module is configured to control the first and second amounts of time to calibrate mismatch between the first and second capacitors, a detector for generating the first and second signals, the detector comprises a photodiode, $Csig/Tint\_sig=Cbgr/Tint\_bgr$, wherein Cbgr corresponds to the first capacitor, Csig corresponds to the second capacitor, Tint_bgr corresponds to the first amount of time, and Tint_sig corresponds to the second amount of time, voltages on the first and second capacitors are sampled and read out differentially, the first and second signals comprise DC current signals, a signal resulting from a subtraction of the first signal from the second signal to obtain an output signal corresponding to a laser spot tracking signal has a slope of zero if no signal errors are present, and/or the output signal comprises part of a focal plane array.

In a further aspect, a method comprises: integrating a first signal for a first amount of time, wherein the first signal comprises a background signal, using a first capacitor; and integrating a second signal for a second amount of time using a second capacitor, wherein the second signal comprises a signal of interest and the background signal, wherein the first and second capacitors have impedance values in a first ratio, and wherein the first amount of time and the second amount of time define a second ratio corresponding to the first ratio.

A method can further include one or more of the following features: subtracting the first signal from the second signal to obtain a signal corresponding to a laser spot tracking signal, the controller module is configured to control the first and second amounts of time to calibrate mismatch between the first and second capacitors, employing a detector for generating the first and second signals, the detector comprises a photodiode, $Csig/Tint\_sig=Cbgr/Tint\_bgr$, wherein Cbgr corresponds to the first capacitor, Csig corresponds to the second capacitor, Tint_bgr corresponds to the first amount of time, and Tint_sig corresponds to the second amount of time, voltages on the first and second capacitors are sampled and read out differentially, the first and second signals comprise DC current signals, a signal resulting from a subtraction of the first signal from the second signal to obtain an output signal corresponding to a laser spot tracking signal has a slope of zero if no signal errors are present, and/or the output signal comprises part of a focal plane array.

In another aspect, a system comprises: a first signal integrating means for integrating a first signal for a first amount of time, wherein the first signal comprises a background signal; and a second signal integrating means for integrating a second signal for a second amount of time, wherein the second signal comprises a signal of interest and the background signal, wherein first and second capacitors have impedance values in a first ratio, and wherein the first amount of time and the second amount of time define a second ratio corresponding to the first ratio.

It should be appreciated that elements of different embodiments described herein may be combined to form other embodiments not specifically set forth above. Various elements, which are described in the context of a single embodiment, may also be provided separately or in suitable combination. Other embodiments, not specifically described herein are also within the scope of the following claims.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which like reference numerals indicate like elements:

FIG. 3 shows a block diagram of the dual mode readout IC of FIG. 1;

FIG. 4 is a flow diagram of a method for transitioning the dual mode readout IC of FIG. 1 between direct injection mode and buffered direct injection mode and vice versa;

FIG. 9 is a graphical representation of background signal integration, laser plus background signal integration, and signal sampling;

FIG. 10A is a graphical representation of the sampled background signal and the sampled laser plus background signal;

FIG. 10B is a graphical representation of the resultant signal after subtraction of the background signal from the laser plus background signal;

DETAILED DESCRIPTION

A dual mode readout integrated circuit (IC) is provided herein that is switchable between a first mode (e.g., direction injection mode) and a second mode (e.g., buffered direction injection) in response to a control signal generated by a user. In some embodiments, the user can generate the control signal based in part on a level of a detection current. The IC includes a switching network disposed between an operational amplifier and an input device to switch the IC between the first and second mode responsive to the control signal. The control signal can include instructions to open or close the one or more switches of the switching network and thus transition the IC between the different modes. The ICs as described herein can be configured to handle high detection currents and low detection currents by switching between the different modes while utilizing the same circuitry (e.g., common amplifier, transistors, etc.).

Figure 1:
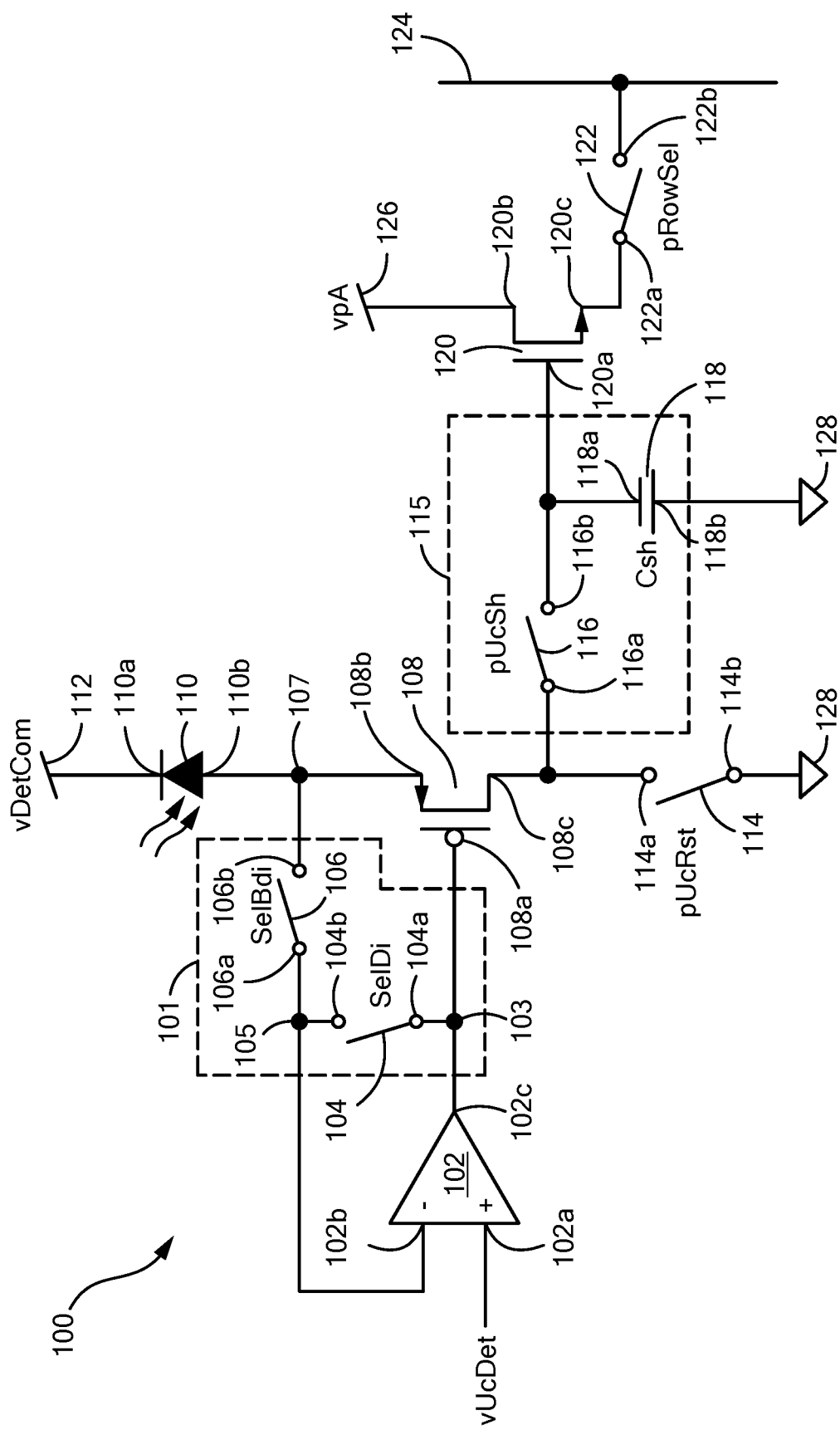
FIG. 1 shows a circuit diagram of a dual mode readout integrated circuit.

Now referring to FIG. 1, a dual mode readout IC 100 includes an operational amplifier 102 having a first input 102a configured to receive a detection bias voltage signal (vUcDet) and a second input 102b configured to receive a feedback signal. In an embodiment, the detection bias voltage signal for DI mode can be set on threshold voltage level lower than for BDI mode to provide the same detector bias voltage as in BDI mode (e.g., voltage at node on detection signal path 107 between a detection node 112 and an input device 108 of FIG. 1). For example, in BDI mode, the detection bias voltage signal (vUcDet) can be approximately equal to the voltage at the detection signal path 107 between detection node 112 and input device 108 of FIG. 1. Thus, the detection bias voltage signal can be approximately equal to the voltage at detection node 112 minus the voltage at detection signal path 107 (e.g., vUcDet=vDetCom−Vbias). In DI mode, the detector bias voltage signal can be approximately equal to a voltage on a control signal path 103. The voltage on the detection signal path 107 can approximately equal to the voltage on the control signal path 103 plus a voltage threshold (e.g., v(107)=v(103)+Vth). Thus, in DI mode, the detection bias voltage signal can be approximately equal to the voltage on detection signal path 107 minus the bias voltage minus the threshold voltage (e.g., vUcDet=vDetCom−Vbias−Vth). The feedback signal will be described in greater detail below.

An output 102c of operational amplifier 102 is coupled to switching network 101 through control signal path 103.

Switching network 101 includes a first switch 104 and a second switch 106. In an embodiment, first and second switches 104, 106 may be provided as multipole switches (here two pole switches). First switch 104 has a first terminal 104a coupled to output 102c of operational amplifier 102 and coupled to a first terminal 108a (e.g., gate terminal) of a input device 108 (e.g., transistor) on control signal path 103. A second terminal 104b of first switch 104 is coupled to second input 102b of operational amplifier 102 and coupled to a first terminal 106a of second switch 106 on feedback signal path 105.

A second terminal 106b of second switch 106 is coupled to a second terminal 110b of a photodiode 110 and coupled to a second terminal 108b (e.g., source terminal) of input device 108 on a detection signal path 107. A first terminal 110a of photodiode 110 is coupled to receive an infrared (IR) signal at detection node 112.

A third terminal 108c (e.g., drain terminal) of input device 108 is coupled to a first terminal 114a of a reset switch 114 and a sample and hold module 115. Sample and hold module 115 includes a sample and hold switch 116 and a capacitor 118. First terminal 114a of reset switch 114 is coupled to a first terminal 116a of sample and hold switch 116. A second terminal 114b of reset switch 114 is coupled to a reference potential 128 (e.g., ground reference potential).

A second terminal 116b of sample and hold switch 116 is coupled to a first terminal 118a of capacitor 118 and a first terminal 120a (e.g., gate terminal) of a source follower 120 (e.g., transistor). A second terminal 118b of capacitor 118 is coupled to a reference potential 128 (e.g., ground reference potential).

A second terminal 120b (e.g., drain terminal) of source follower 120 is coupled to an analog power supply 126. A third terminal 120c (e.g., source terminal) of source follower 120 is coupled to a first terminal 122a of a row select switch 122. A second terminal 122b of row select switch 122 is coupled to a unit cell array 124. In an embodiment, second terminal 122b is configured to selectively couple to one of a plurality of rows of unit cell array 124 to read data collected at the particular row of unit cell array 124. In some embodiments, unit cell array can be provided as a focal plane array.

Input device 108 and/or source follower 120 may include as a transistor. In some embodiments, input device 108 and/or source follower 120 may include a unit gain amplifier or a common-drain amplifier (also referred to as a source follower circuit).

As illustrated in FIG. 1, IC 100 can be configured to operate in both DI and BDI mode using common architecture and circuit components. For example, IC 100 includes a single operational amplifier 102 to perform operations for both DI mode and BDI mode. Further, circuit components such as input device 108, photodiode 110, reset switch 114, sample and hold module 115, source follower 120 and row select switch 122 can be used for both DI mode and BDI mode.

In operation, switching network 101 can be configured to switch IC 100 between a first mode and a second mode or between the second mode and the first mode in response to a control signal. The control signal can be generated by a user in response to a level of the detection current. For example, photodiode 110 can detect an IR signal and generate the detection current (e.g., output of photodiode 110 can be the detection current). The detection current can be compared to a current threshold to determine whether IC 100 should operate in DI mode or BDI mode In some embodiments, when the detection current is greater than the current threshold, the control signal can be generated by the user to select the first mode (e.g., DI mode) and when the detection current is less than or equal to the current threshold, the control signal can be generated by the user to select the second mode (e.g., BDI mode). To transition the IC 100 between modes, the control signal can be provided to switching network 101.

For example, in response to the detection current being greater than the current threshold, the control signal can be generated having instructions to close first switch 104 and open second switch 106. In such an embodiment, the IC 100 can be transitioned to the first mode and the output 102c of operational amplifier 102 is coupled to the second input 102b of operational amplifier 102 and the feedback signal provided to the second input 102b of operational amplifier 102 can follow the output 102c of operational amplifier 102.

In response to the detection current being less than or equal to the current threshold, the control signal can be generated having instructions to open first switch 104 and close second switch 106. In such an embodiment, the second terminal 110b of photodiode 110 is coupled to the second input of operational amplifier 102 and the feedback signal provided to the second input 102b of operational amplifier 102 can follow the detection current generated by photodiode 110.

Figure 1A:
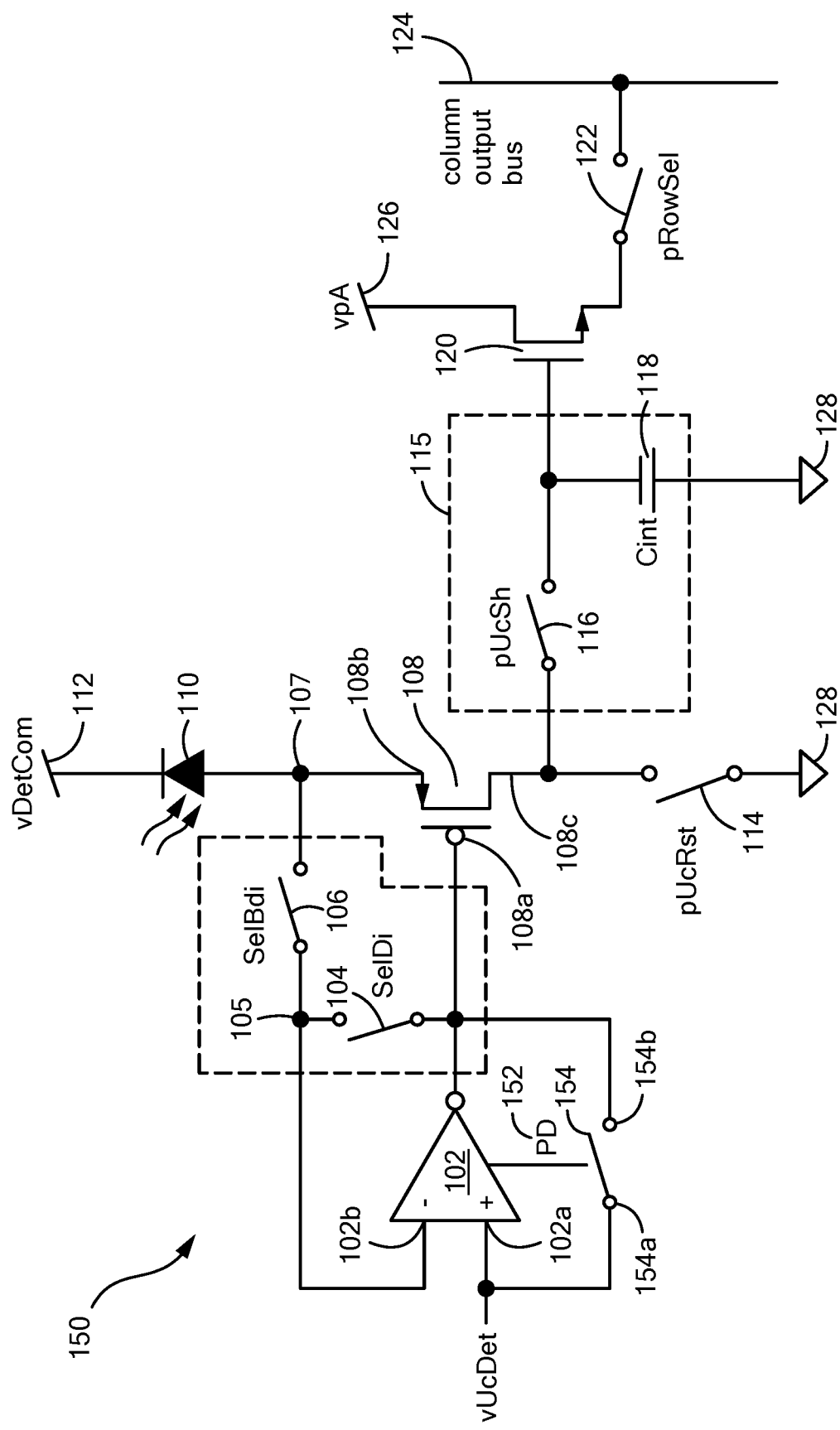
FIG. 1A shows a circuit diagram of the dual mode readout integrated circuit of FIG. 1 having a power down signal.

Now referring to FIG. 1A, in which like reference numerals indicate like elements, a power down signal 152 can be provided to operational amplifier 102 of IC 100 to turn off or otherwise power down operational amplifier 102. As illustrated in FIG. 1A, a first terminal 154a of a power down switch 154 is coupled to the detection bias voltage signal and a second terminal 154b of power down switch 154 is coupled to control signal path 103 and thus, first terminal 108a of input device 108. When power down signal 152 is set low, the first terminal 154a can be disconnected from the second terminal 154b (e.g., open) and IC 100 can operate as described above with respect to FIG. 1.

When power down signal 152 is set high, and first and second switches 104, 106 can be set low, the first terminal 154a can be coupled to second terminal 154b to turn off operational amplifier 102 and provide the detection bias voltage signal to the first terminal 108a of input device 108. In such an embodiment, IC 100 can be configured for DI mode without operating as a detector bias voltage signal (vUcDi) shield. In some embodiments, the power down signal can be used lower a power consumption of the IC 100.

Figure 2:
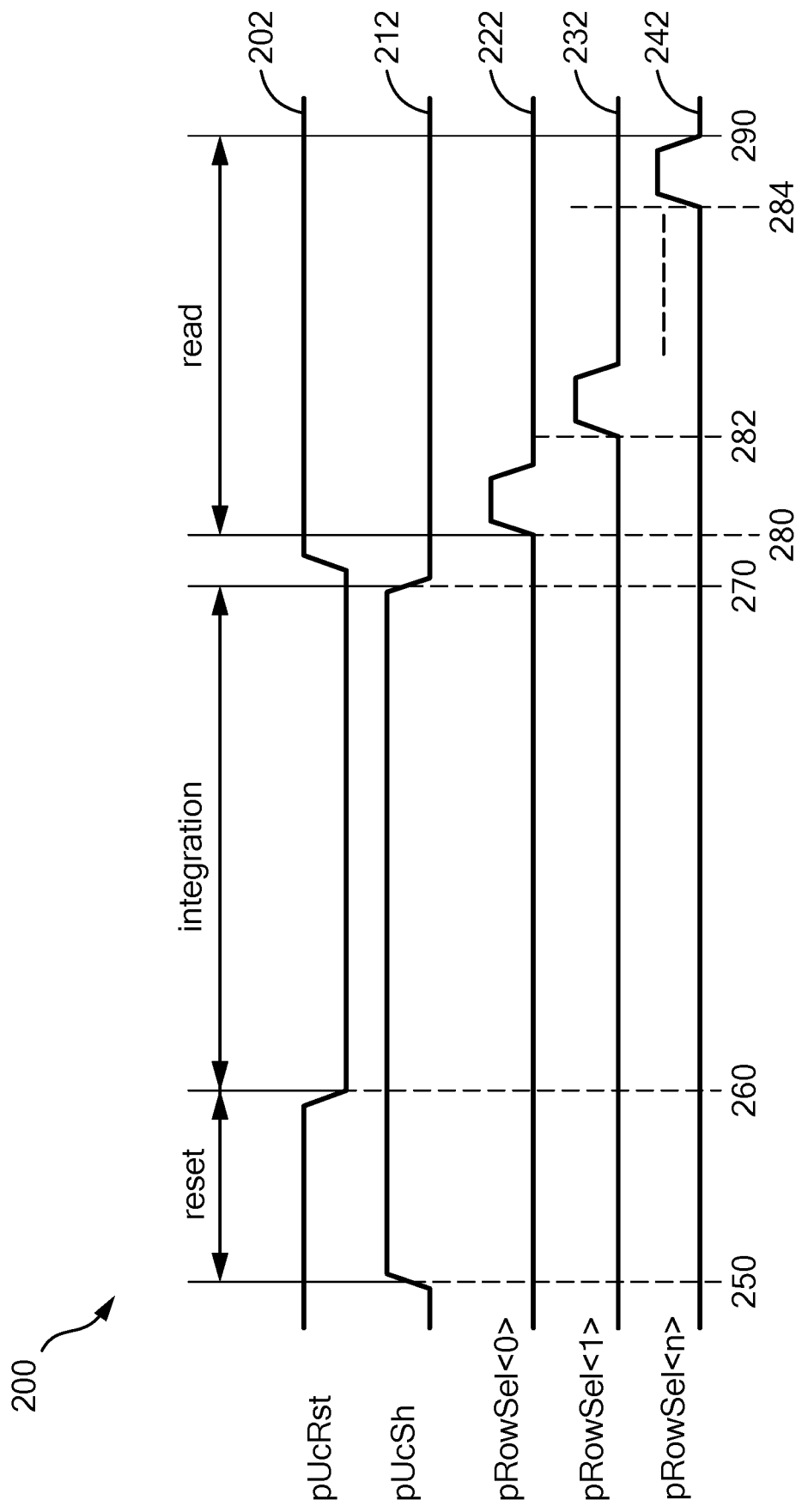
FIG. 2 shows a diagram of timing signals for operating the dual mode readout IC of FIG. 1.

Now referring to FIG. 2, a timing diagram 200 is provided showing example positions of the reset switch 114, the sample and hold switch 116, and the row select switch 122 of FIG. 1, during a reset phase, an integration phase, and a read phase of the IC 100 of FIG. 1. As illustrated in FIG. 2, the position of reset switch 114 is represented by reset waveform 202, the position of sample and hold switch 116 is represented by sample and hold waveform 212, and the position of row select switch 122 is represented by a first row waveform 222, a second row waveform 232, and an N row waveform 242. In an embodiment, each of the waveforms may transition between a first level (e.g., 0) and a second level (e.g., 1) to indicate a change in the position of the corresponding switch.

The reset phase begins at a first time period 250, with the reset switch 114 closed and the reset waveform 202 at the second level and the sample and hold switch 116 closed and the sample and hold waveform 212 transitions from the first level to the second level. During the reset phase, a voltage across capacitor 118 of FIG. 1 can be reset as reset switch 114 is coupled to ground potential 128 and with sample and hold switch 116 closed, capacitor 118 can discharge stored energy to reset. In an embodiment, the duration of reset phase of IC 100 corresponds to a duration it takes for capacitor 118 to discharge.

At second time period 260, the integration phase begins and the reset switch 114 transitions from the closed position to an open position and thus reset waveform 202 transitions from the second level to a first level. The sample and hold switch 116 remains closed and thus the sample and hold waveform 212 stays at the second level. During the integration phase, capacitor 118 is charged with the detection current generated by photodiode 110.

In an embodiment, photodiode 110 senses an IR signal and generates the detection current responsive to the IR signal. The detection current is provided to the second terminal 108b of input device 108. As sample and hold switch 116 is in a closed position, the first terminal 118a of capacitor 108 is coupled to the third terminal 108c of input device 108 to receive the detection current and charge capacitor 118. The duration of the integration phase and the time it takes for capacitor to charge from the detection current may be referred to as an integration time ($T_{int}$).

At a third time period 270, the integration phase can end and the sample and hold switch 116 can transition from the closed position to the open position and sample and hold waveform 212 can transition from the second level to the first level. Thus, capacitor 118 is no longer coupled to third terminal 108c of input device 108 to receive the detection current. Further, reset switch 114 can transition from the open position to the closed position and reset waveform 202 can transition from the first level to the second level. With reset switch 114 in the closed position, third terminal 108c of input device 108 is coupled to ground reference 128.

At a fourth time period 280, the read phase begins and row select switch 122 can selectively couple to one of a plurality of rows of unit cell array 124 to read data from the respective row.

For example, and as illustrated in FIG. 2, at fourth time period 280, row select switch can coupled to a first row of unit cell array 124 to read data from the first row and first row waveform 222 can transition from the first level to the second level.

At a fifth time period 282, row select switch 122 can couple to a second row of unit cell array 124 to read data from the second row. Responsive to row select switch 122 coupling to second row, first row waveform 222 can transition from the second level to the first level and second row waveform 232 can transition from the first level to the second level.

At a sixth time period 284, row select switch 122 can couple to a Nth row of unit cell array 124 to read data from the Nth row. Responsive to row select switch 122 coupling to Nth row, second row waveform 232 can transition from the second level to the first level and Nth row waveform 242 can transition from the first level to the second level. It should be appreciated that although FIG. 2 shows data being read form three rows of unit cell array 124, row select switch 122 and thus IC 100 can be configured to read data from each row of unit cell array 124 and the number of rows of unit cell array 124 can be selected based at least in part on a particular application of unit cell array 124.

At a seventh time period 290, the read phase can end and row select switch 122 can disconnect from unit cell array 124 such that it is not reading data from any of the rows of unit cell array 124. Further, Nth row waveform 242 can transition from the second level to the first level.

Now referring to FIG. 3, a block diagram of a dual mode readout IC 300 is provided. IC 300 may be the same as or substantially similar to IC 100 of FIG. 1. IC 300 includes a unit cell array 302 (i.e., unit cell array 124 of FIG. 1), row address circuitry 312, an analog to digital converter (ADC) 332 and a serializer 342.

Unit cell array 302 can be provided as a two-dimensional array having N rows and M columns. The specific size of unit cell array 320 can be based at least in part on a particular application of IC 300. Unit cell array 320 can include a plurality of pixels (e.g., light sensing pixels) arranged in the N×M array and the pixels can be configured to sense light signals or infrared signals incident on the unit cell array 302. The unit cell array 302 can include additional circuitry (see IC 100 of FIG. 1) to detect properties of the signals incident on the unit cell array 302 and can generate an electrical signal (e.g., detection current, data at each row of unit cell array 124 of FIG. 1) corresponding to a number of photons detected at each pixel. The electrical signal can include an electrical charge, voltage, or resistance and can be measured and used to construct an image of an object, scene, or phenomenon that emitted the photons of the signal incident on the unit cell array 302. In some embodiments, unit cell array 302 can be provided as a focal plane array.

As illustrated in FIG. 3, row address circuitry 312 is coupled to unit cell array 302. Row address circuitry 312 can include a plurality of row address circuits that are coupled to different rows of unit cell array 302. Each of the row address circuits can be configured to address the particular row that are coupled to and generate a pulse or other form of signal to activate the respective row during different phases of operation (e.g., reset, integration, read) of unit cell array 302.

ADC 332 is coupled to unit cell array 302. ADC 332 can be configured to convert a signal generated by unit cell array 302 and corresponding to the signals received at unit cell array 302 to a digital signal. Serializer 342 is coupled to ADC 332. Serializer 342 can be configured to receive the digital signal corresponding to the signals received at unit cell array 302 and load them into one or more registers, such as but not limited to, a shift register or a memory register. In some embodiments, serializer 342 can be coupled to additional circuitry (not shown) or outputs to transmit the received digital signals.

Now referring to FIG. 4, a method 400 for transitioning the dual mode readout IC 100 of FIG. 1 between a first mode (e.g., DI mode) and a second mode (e.g., BDI mode) and vice versa is provided. In an embodiment, the IC 100 can be set and/or transitioned between the first and second modes in response to a control signal generated by a user.

Method 400 begins at block 402 by generating a detection current on a detection signal path of IC 100 in response to an IR signal. IC 100 can be provided as a dual mode readout IC coupled to unit cell array 124, which may be but is not limited to being, a focal plane array. The IC 100 can include an operational amplifier 102 having a first input 102a and a second input 102b. The first input 102a can be configured to receive a detection bias voltage signal and the second input 102b can be coupled to a feedback signal path 105 to receive a feedback signal. The IC 100 further includes an input device 108 having a first terminal 108a coupled to an output 102c of the operational amplifier 102, a second terminal coupled 108b to the detection signal path 107 to receive the detection current, and a third terminal 108c coupled to a reset switch 114 and a sample and hold module 115 of the IC 100. A photodiode 110 can be coupled to the second terminal 108b of the input device 108 and be configured to sense an IR signal and generate the detection current response to the IR signal.

At block 404, a control signal can be generated. In an embodiment, the control signal can be generated by a user, administrator or any individual or system operating IC 100. The control signal can include instructions to modify a position of a first switch 104 and/or a second switch 106 of a switching network 101 in response to the comparison. For example, in first mode (DI mode), the control signal can be generated having instructions to close first switch 104 and open second switch 106. In such an embodiment, the IC 100 can be transitioned to the first mode and the output 102c of operational amplifier 102 is coupled to the second input 102b of operational amplifier 102 and the feedback signal provided to the second input 102b of operational amplifier 102 can follow the output 102c of operational amplifier 102. In second mode (BDI mode), the control signal can be generated having instructions to open first switch 104 and close second switch 106. In such an embodiment, the second terminal 110*b* of photodiode 110 is coupled to the second input of operational amplifier 102 and the feedback signal provided to the second input 102*b* of operational amplifier 102 can follow the detection current generated by photodiode 110.

In some embodiments, to determine the appropriate mode for IC 100, the detection current can be compared to a current threshold. The current threshold can represent a threshold between a high detection current and a low detection current. Based on the comparison, the IC 100 can be configured to operate in the first mode or second mode or stated differently, in DI mode or BDI mode. For example, when the detection current is greater than the current threshold, DI mode can be selected and the control signal can be provided to the IC 100 to transition the IC to DI mode. When the detection current is less than or equal to the current threshold, BDI mode can be selected and a control signal can be provided to the IC 100 to transition the IC to BDI mode.

The switching network 101 can be disposed between the operational amplifier 102 and the input device 108 and be configured to transition the IC 100 between DI mode and BDI mode. For example, the first switch 104 can be coupled between the output 102*c* of the operational amplifier 102 and the feedback signal path 105 and the second switch 106 can be coupled between the detection signal path 107 and the feedback signal path 105.

At block 406, the IC 100 is transitioned from the first mode (e.g., DI mode) to the second mode (e.g., BDI mode) or from the second mode to the first mode in response to the control signal. The control signal can be provided to the first switch 104, the second switch 106 or both the first and second switches 104, 106. The control signal can include instructions to close or open the first switch 104, the second switch 106 or both the first and second switches 104, 106.

For example, during DI mode, the control signal can include instruction to close the first switch 104 and open the second switch 106 such that the output 102*c* of the operational amplifier 102 is coupled to the second input 102*b* of the operational amplifier 102. In such an embodiment, having the second switch 106 open, the second terminal 110*b* of the photodiode 110 is coupled to the second terminal 108*b* of the input device 108.

During BDI mode, the control signal can be configured to open the first switch 104 and close the second switch 106 such that the second terminal 110*b* of the photodiode 110 and the second terminal 108*b* of the input device 108 are coupled to the second input 102*b* of the operational amplifier 102.

In another aspect, a laser spot tracker determines laser spot position using ratioed capacitors. Embodiments of a laser spot tracker output a laser spot position in the presence of a background signal at fast frame rates. Because background signals, such as dark current and background scene, induce current that can vary both spatially and temporally, these signals should be removed from the signal of interest to calculate laser spot position accurately.

Conventional laser spot trackers with non-uniformity correction cannot remove temporally varying background signals. In addition, known current mode background subtraction methods rely on current sources working in a subthreshold region where current exponentially depends on the gate source voltage. Such systems suffer from high noise, e.g., switching noise voltage converted noise current.

Figure 5:
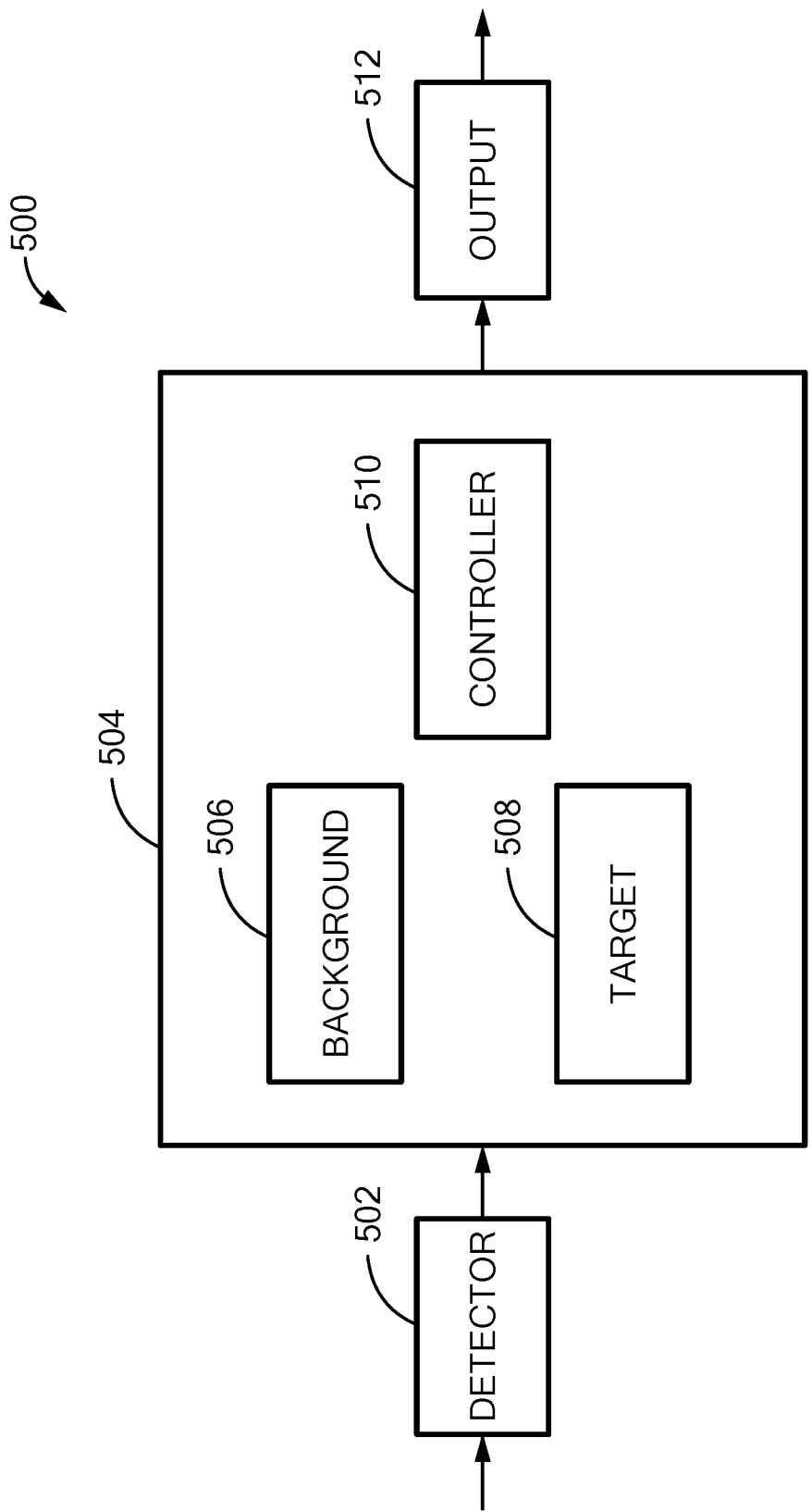
FIG. 5 is a block diagram of an example laser tracking system having ratioed capacitors.

FIG. 5 shows an example signal detector system 500 having a detector module 502 coupled to a signal processing module 504. In an example embodiment, the signal processing module 504 includes a background signal processing module 506 and target signal processing module 508. A controller module 510 controls operation of the background signal module 506 and the target signal processing module 508 and provides timing signals, as described more fully below. An output module 512 is coupled to the signal processing module 504 for outputting an output signal to array, for example.

Figures 6, 7, 8:
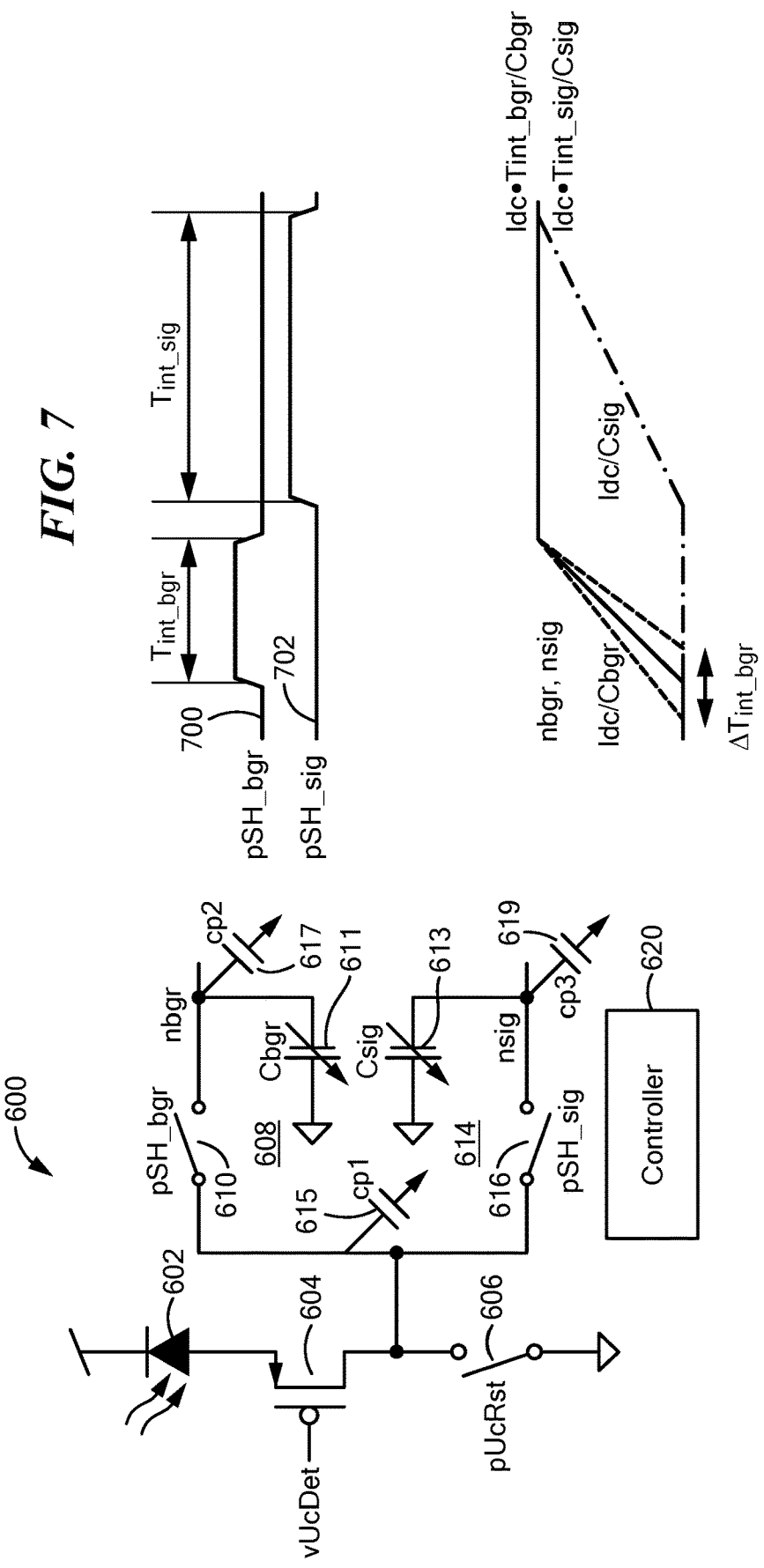
FIG. 6 is an illustrative implementation of an example signal detection circuit having ratioed capacitors.
FIG. 7 is a waveform diagram having timing signals for background signal integration and laser plus background signal integration.
FIG. 8 is an example representation of ratioed capacitor charging.

FIG. 6 shows an example circuit implementation 600 of the signal detector system 500 of FIG. 5. The detector includes a photodetector 602, such as a photodiode. As is known in the art, a photodiode comprises a semiconductor device that converts light into current as photons are absorbed in the photodiode. In embodiments, a first switching element 604, such as a transistor, is coupled to the photodetector 602 for selectively enabling light detection. A switch 606 can be provided to reset the circuit 600 and drain capacitor charge, as described more fully below.

A background signal processing module 608 includes a background integration switch mechanism 610 and a background capacitor 611 for integrating a background signal. In embodiments, the impedance of the background capacitor 611 can be adjusted.

A signal processing module 614 includes a target integration switch mechanism 616 and a signal capacitor 613 for integrating a signal, which can comprise a laser plus background signal. In embodiments, the impedance of the signal capacitor 613 can be adjusted.

In the illustrated embodiment, various parasitic capacitors 615, 617, 619 are shown coupled across the background integration switch 610 and the target integration switch 616. It is understood that in embodiments, parasitic capacitors are not physical elements, but rather, elements included to model parasitic circuit effects. It is further understood that additional capacitors and other circuit components can be added to meet the needs of a particular application.

In embodiments, a controller 620 controls the state of the background integration switch 610 and the target integration switch 616, for example. The background integration switch 610 and the target integration switch 616 can be controlled to have a conductive or non-conductive state to selectively integrate the background signal or the target signal at a given time.

FIG. 7 shows an illustrative waveform diagram with a background control signal pSH_bgr 700 and a target control signal pSH_sig 702. When the background control signal 700 is active, shown as logically high in the illustrated embodiment, for time Tint_bgr, the background integration switch 610 provides a conductive path so that the background capacitor 611 (FIG. 6) charges to a given voltage as the signal is integrated.

When the control signal 702 is active, shown as logically high in the illustrated embodiment, the target integration switch 616 provides a conductive path so that the signal capacitor 613 (FIG. 6) charges to a given voltage as the signal is integrated. In embodiments, dual integration of the background and laser plus background signals allows removal of the background signals by subtraction, as described more fully below. In embodiments, it is understood that the integrated signals have DC currents.

In embodiments, the background signal is integrated for time Tint_bgr as charge is stored on background capacitor 611, and then the laser plus background is integrated for time Tint_sig while charge is stored on signal capacitor 613. The integrated background signal and laser plus background signal can be readout in differential form.

In embodiments, as shown in FIG. 8, the same voltage outputs are obtained for same current provided that Csig/Tint_sig=Cbgr/Tint_bgr=K·Csig/K·Tint_sig since, as is well known that i=Cdv/dt, where i is current, C is capacitance, and dv/dt is the change in voltage over time. It will be appreciated that selecting K<1 may save time and area, as well as by selecting relatively small values for Cbgr and Tint_bgr. In embodiments, mismatch between Csig and Cbgr can be calibrated out by fine control of Tint_bgr and/or Tint_sig. It is understood that the ratio of Csig and Cbgr should be kept constant to the extent practical. It will be appreciated that for smaller values of Csig and Cbgr parasitics and mismatch it can be challenging to maintain the ratio constant. In an embodiment, Cbgr corresponds to background capacitor 611 and Csig corresponds to signal capacitor 613 in FIG. 6.

In example embodiments, the background signal is integrated for a first amount of time Tint_bgr, using the background capacitor 611. The background and signal of interest is integrated for a second amount of time Tint_sig using the signal capacitor 613. The background and signal capacitors 611, 613 have impedance values in a first ratio and the first amount of time Tint_bgr and the second amount of time Tint_sig define a second ratio corresponding to the first ratio since as noted above, Csig/Tint_sig=Cbgr/Tint_bgr=K·Csig/K·Tint_sig.

FIG. 9 shows example waveforms for the circuit of FIG. 6 when no laser is applied. During a first time t1, from about 1.9 µs to about 3.4 µs, which may correspond to Tint_bgr in FIG. 7, the background signal is integrated. In the illustrated embodiment, the dc current integrated on background capacitor 611 (FIG. 6) can vary from about 0.5 nA to about 1.2 nA. As can be seen, a number of curves have differing slopes depending on the current level.

During a second time t2, from about 3.8 µs to about 6.8 µs, which may correspond to Tint_sig in FIG. 7, the laser plus background (LB) signal is integrated. Curves for various current levels are shown. In the illustrated embodiment, the integration time of the LB signal is about twice as long at the integration time of the background signal, the slopes of corresponding background signal to LB signal is about two to one, and the ratio of the background capacitor, e.g., background capacitor 611 in FIG. 6, to the signal capacitor, e.g., 613 in FIG. 6, is about two to one.

After the signal is integrated, at a third time t3, which is shown at about 8 µs, the signal and background voltage levels on the respective capacitors 611 (Cbgr), 613 (Csig) are sampled. It will be appreciated that the sampled voltage levels will be somewhat less than the background and LB signal levels reached during integration. The sampled background and LB signals can be read out differentially.

FIG. 10A shows further detail of the sampled values of LB signal and background and FIG. 10B shows a plot of LB signal minus background. As can be seen in FIG. 10A, the sampled signal varies from about 416 mV for a DC current of about 0.5 to about 460 mV for a DC current of about 1.2 nA. The signal range of about 460 mV to about 416 mV is about 44 mV. The background samples range from about 410 mV to about 454 mV. As can be seen, the voltage different between the signal and background is about 6 mV.

Figure 10C:
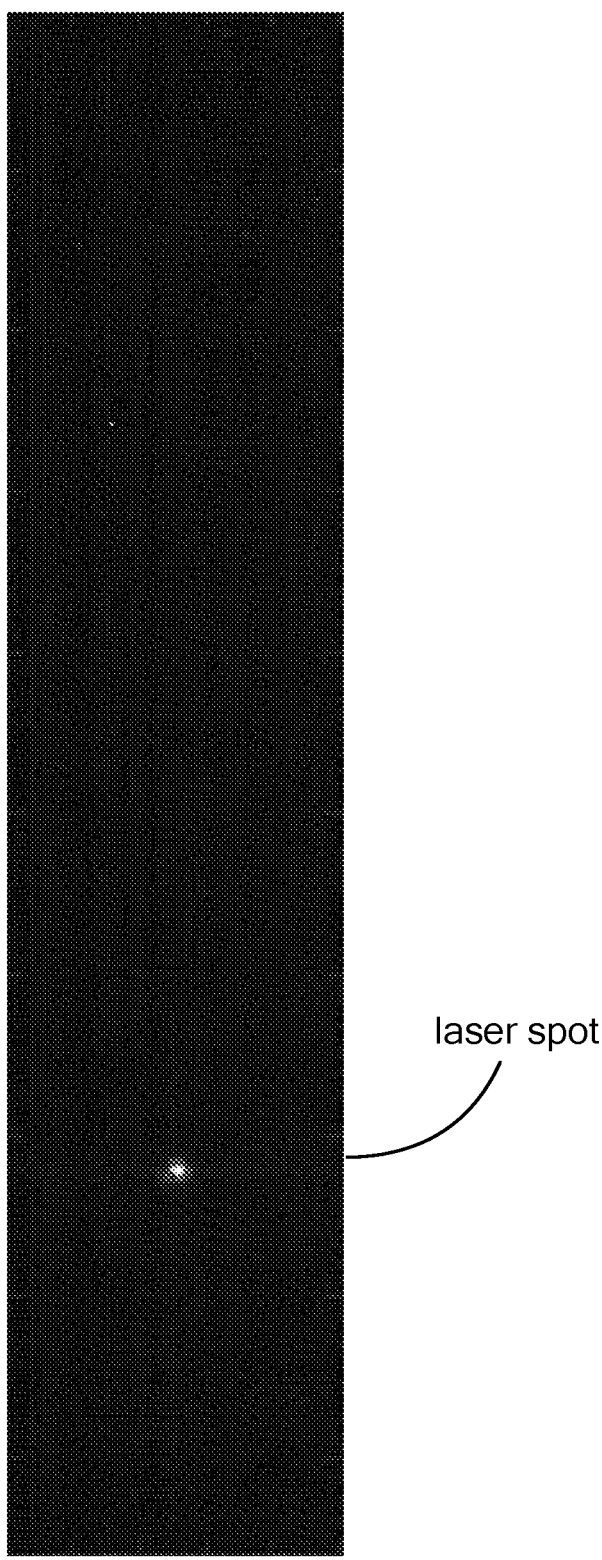
FIG. 10C is an example display showing a laser spot.

FIG. 10B shows a plot of signal minus background samples. It will be appreciated that in an ideal circuit, the signal minus background plot would be level, i.e., slope=0. However, in the illustrative circuit implementation of FIG. 6, for example, errors from parasitics and other sources, results in a plot having a given slope. As can be seen, at 0.5 nA of DC current, 44 mV of signal range (FIG. 9A) corresponds to about 0.406 mV signal-background so that the output of the sensor is reduced from 44 mV to about 0.406 mV. It is understood that DC current corresponds to background plus dark. FIG. 10C shows an example output that includes a detected laser spot.

Figure 10E:
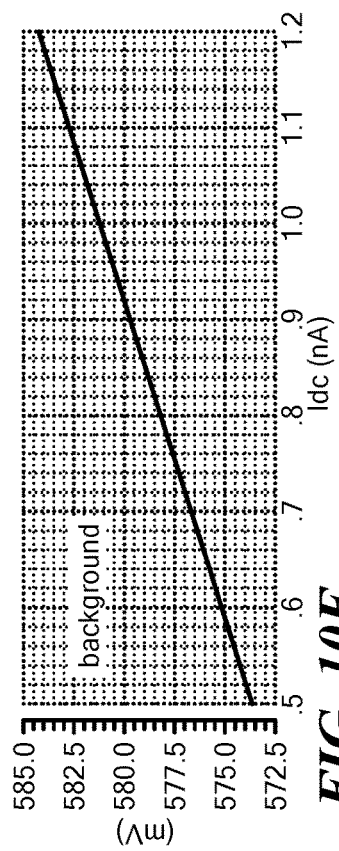
FIG. 10E is a graphical representation of the sampled background signal.
Figure 10F:
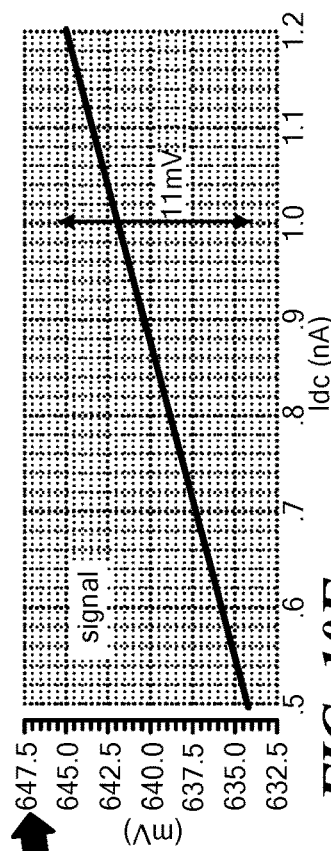
FIG. 10F is a graphical representation of the sampled laser plus background signal integration.
Figure 10G:
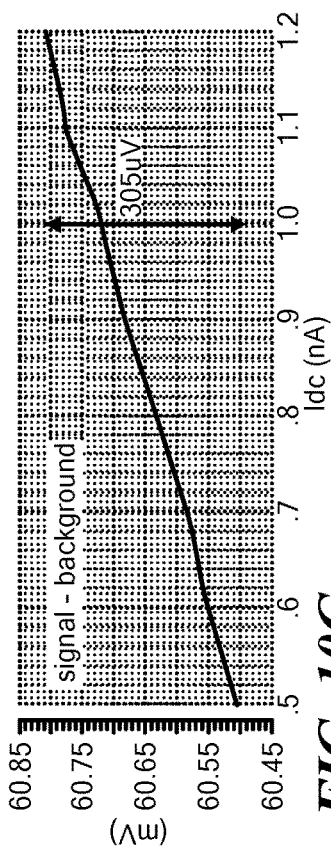
FIG. 10G is a graphical representation of the resultant signal after subtraction of the background signal from the laser plus background signal.
Figure 10D:
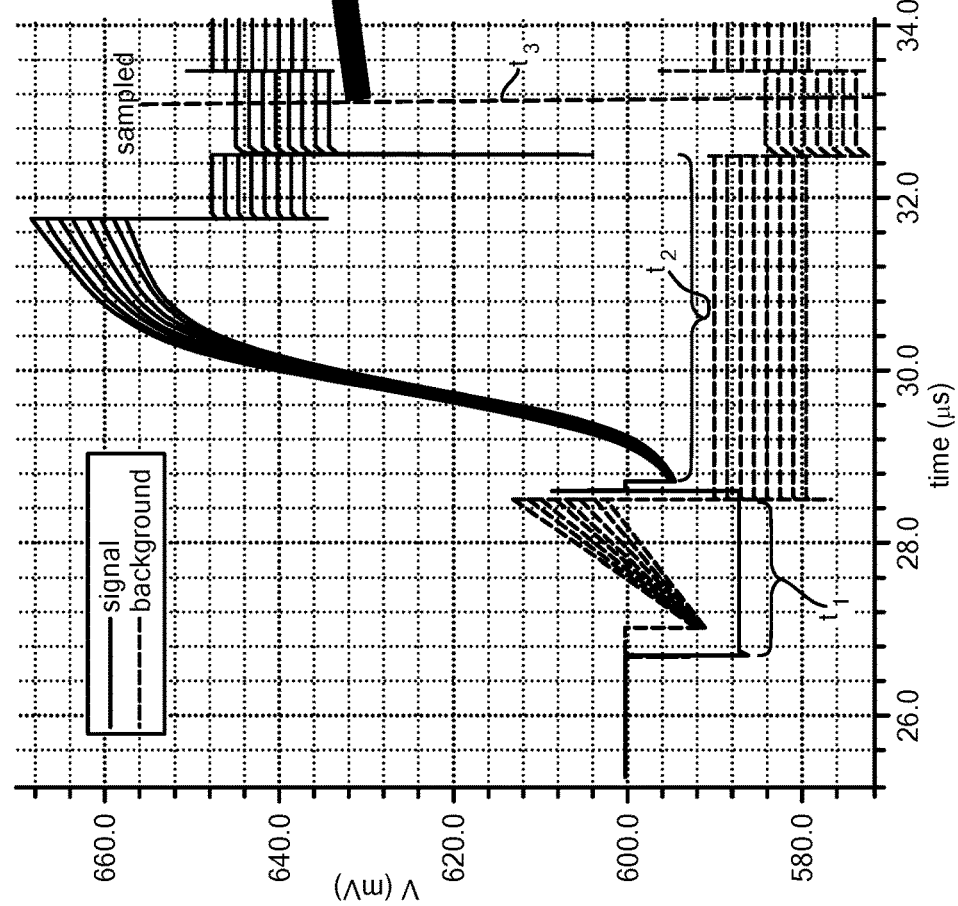
FIG. 10D is a graphical representation of background signal integration, laser plus background signal integration, and signal sampling while a laser is applied.

FIG. 10D shows example waveforms for the circuit of FIG. 6 when a laser is applied. During a first time t1, which may correspond to Tint_bgr in FIG. 7, the background signal is integrated, and during a second time t2, which may correspond to Tint_sig in FIG. 7, the laser plus background (LB) signal is integrated. Curves for various current levels are shown. FIG. 10E shows an example sampled background signal and FIG. 10F shows an example sampled LB signal. As can be seen in FIG. 10F, the LB signal level has a range of about 11 mv, which corresponds to about 305 µV after subtraction of the background signal, as can be seen in FIG. 10G. That is, changes due to DC current (background plus dark) are reduced from about 11 mV to about 305 µV by subtracting the background signal.

It is understood that an output can form part of a focal plane array having row address circuitry coupled to unit cell array, as shown in FIG. 3. U.S. Patent Publication 2012/0248288 of Linder et al, shows an example ROIC laser tracker that includes a focal plane array, which is incorporated herein by reference.

Figure 11:
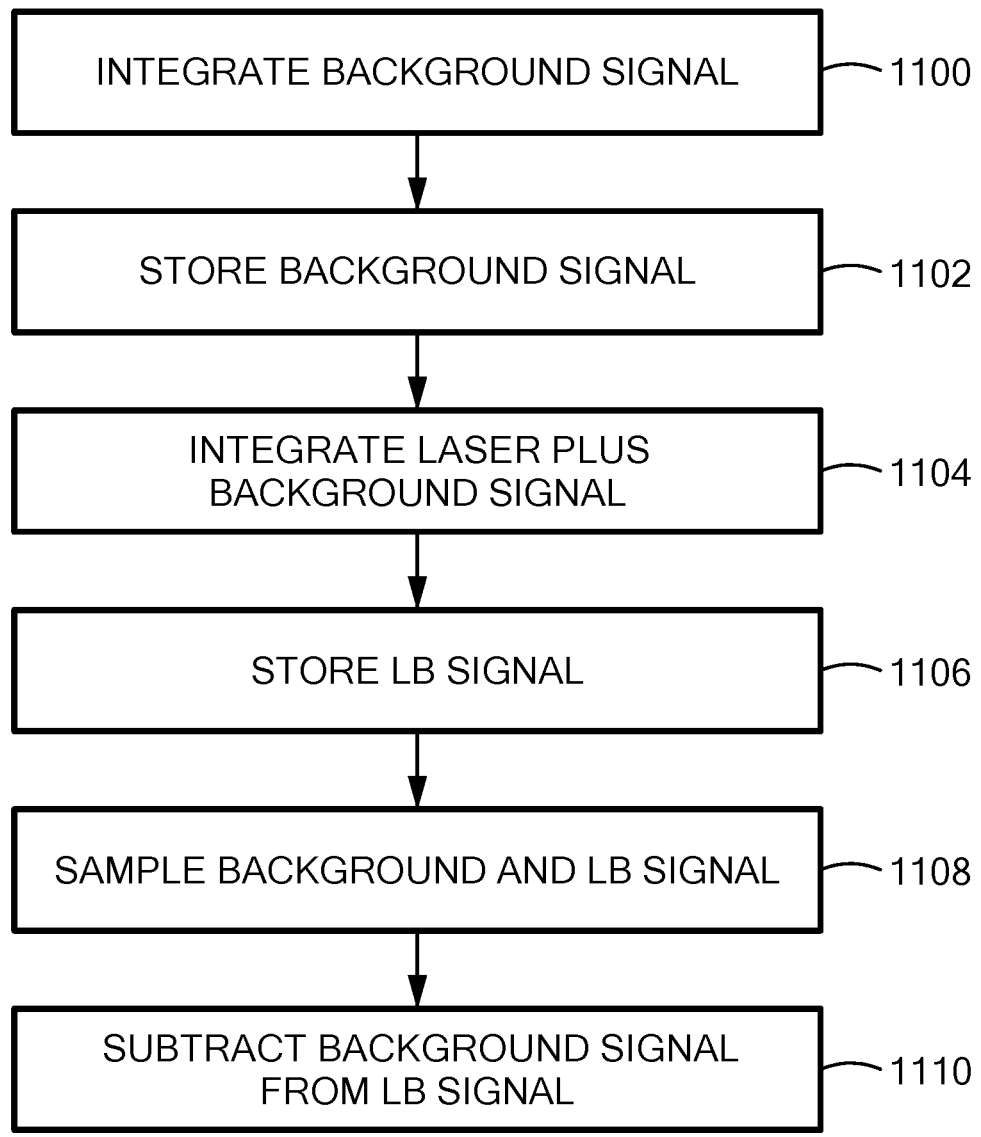
FIG. 11 is a flow diagram showing an example sequence of steps for detecting a laser spot signal using ratioed capacitors.

FIG. 11 shows an example sequence of steps for providing a laser spot tracker in accordance with example embodiments of the invention. In step 1100, a background signal is integrated for a period of time Tint_bgr. In embodiments, and referring to FIG. 6, charge is stored on a background capacitor 611 during the integration time in step 1102. In step 1104, a laser plus background (LB) signal is integrated for a period of time Tint_sig. In embodiments, charge is stored on a signal capacitor 613 in step 1106. In step 1108, the voltage values for the background and LB signal are sampled and read out. In embodiments, the samples are read out differentially. In step 1110, the background signal is subtracted from the LB signal from which an output can be generated.

In example embodiments, the impedances of the background capacitor and the signal capacitor have a selected ratio. In one embodiment, the impedances of the capacitors and the integration times have a selected relationship, such as Csig/Tint_sig=Cbgr/Tint_bgr. In an example, embodiment, the integration time of the signal of interest (i.e., the LB signal) is about twice as long at the integration time of the background signal, the slopes of corresponding background signal to the LB signal is about two to one, and the ratio of the background capacitor, e.g., Cbgr in FIG. 6, to the signal capacitor, e.g., Csig in FIG. 6, is about two to one.

Embodiments of the invention provide a laser spot tracker that outputs a laser spot position in the presence of background signal at fast frame rate. The background signal, which can vary spatially and temporally, can be efficiently removed to calculate laser spot position accurately using ratioed background and signal capacitors.

It is understood that embodiments of the invention can include implementations in hardware, which can include programmable components, software, and combinations thereof. For example, circuits including capacitors can be used to obtain voltage values that can be processing using microprocessors. A wide variety of implementations will be readily apparent to one skilled in the art.

Figure 12:
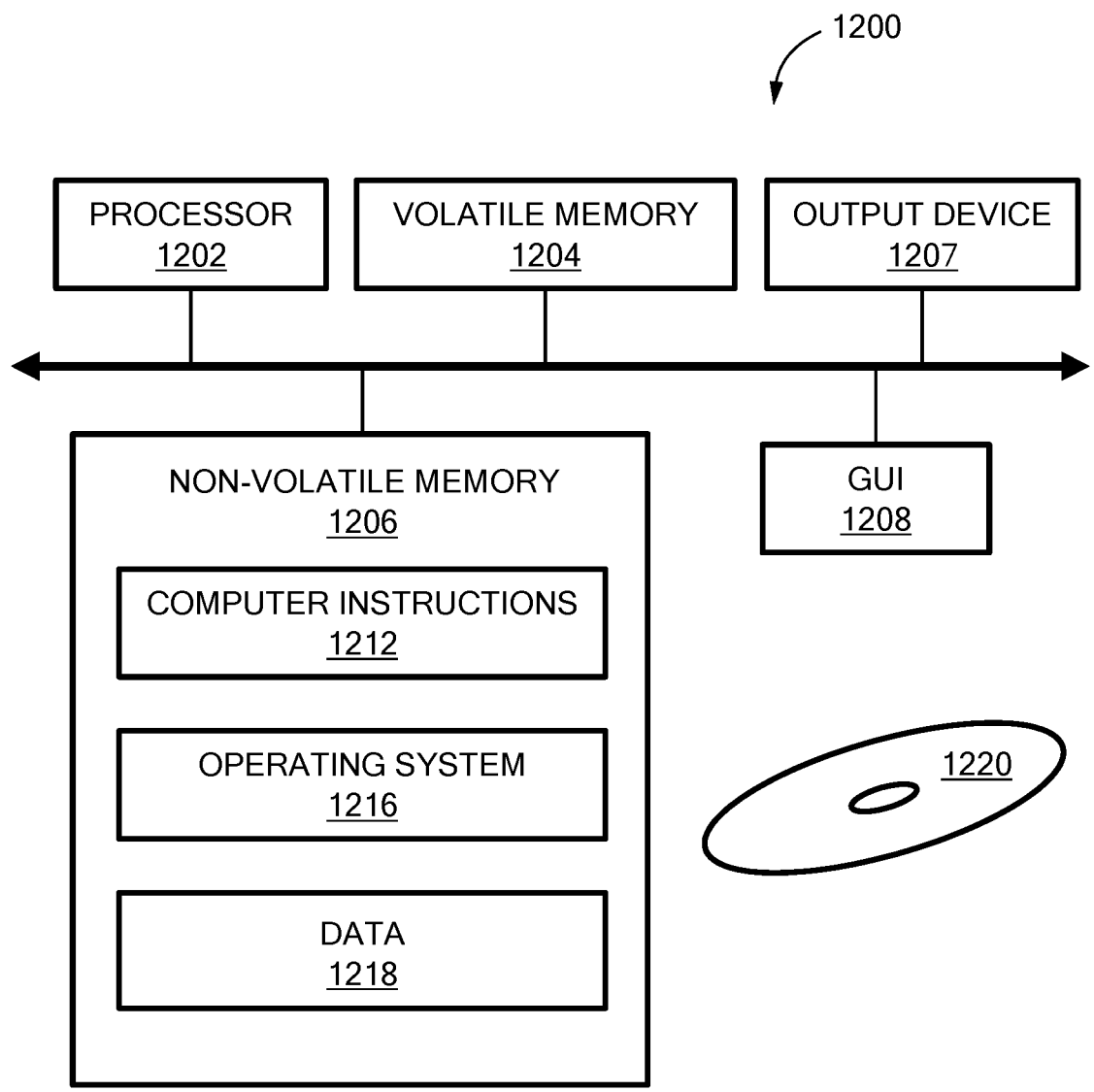
FIG. 12 is a block diagram of an example computer that can perform at least a portion of the processing described herein.

FIG. 12 shows an exemplary computer 1200 that can perform at least part of the processing described herein, such as at least a portion of the example process of FIG. 4 and/or example process of FIG. 11. The computer 1200 includes a processor 1202, a volatile memory 1204, a non-volatile memory 1206 (e.g., hard disk), an output device 1207 and a graphical user interface (GUI) 1208 (e.g., a mouse, a keyboard, a display, for example). The non-volatile memory 1206 stores computer instructions 1212, an operating system 1216 and data 1218. In one example, the computer instructions 1212 are executed by the processor 1202 out of volatile memory 1204. In one embodiment, an article 1220 comprises non-transitory computer-readable instructions.

In embodiments, processor 1202 performing instructions 1212 can operate to receive the digitized data from an ADC, such as ADC 332, and serialize the data 342. In some embodiments, the processor 1202 can perform instructions 1212 to generate signals for controlling switches, e.g., pSHbgr, pSHsig, to achieve desired integration times, e.g., Tint_bgr, Tint_sig.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An integrated circuit comprising:
   an operational amplifier having a first input and a second input, wherein the second input is coupled to a feedback signal path;
   a switching network having a first switch and a second switch, wherein the first switch is coupled between an output of the operational amplifier and the feedback signal path and the second switch is coupled between a detection signal path and the feedback signal path, and wherein the switching network is configured to switch the integrated circuit between a first mode and a second mode responsive to a level of a detection current generated on the detection signal path;
   an input device having a first terminal coupled to the output of the operational amplifier, and a second terminal coupled to the detection signal path to receive the detection current, and a third terminal, wherein the input device comprises a switching device and the first terminal of the input device comprises a gate terminal, wherein the output of the operational amplifier determines a conductive state of the input device in the first and second modes,
   wherein the first mode comprises a direct injection (DI) mode and the second mode comprises a buffered direct injection (BDI) mode, and wherein during DI mode, the first switch is closed and the second switch is open such that the output of the operational amplifier is coupled to the second input of the operational amplifier, and during BDI mode, the first switch is open and the second switch is closed such that a second terminal of the first switch is coupled to the second input of the operational amplifier,
   wherein the detection path includes a photodiode coupled to the second terminal of the input device, wherein the photodiode is configured to detect an infrared signal and generate the detector current responsive to the infrared signal; and
   a sample and hold module having a sample and hold switch and a capacitor, wherein the sample and hold switch has a first terminal coupled to the third terminal of the input device and a second terminal coupled to a first terminal of the capacitor, and the capacitor has a second terminal coupled to a reference potential.

2. The integrated circuit of claim 1, wherein the second terminal of the input device is coupled to the second input of the operational amplifier through the second switch.

3. The integrated circuit of claim 1, wherein the switching network transitions the integrated circuit to the first mode when the level of the detection current is greater than a current threshold and transitions the integrated circuit to the second mode when the level of the detection current is less than the current threshold.

4. The integrated circuit of claim 1, wherein the first input of the operation amplifier is configured to receive a detection bias voltage signal.

5. The integrated circuit of claim 1, further comprising a reset switch having a first terminal coupled to the third terminal of the input device and a second terminal coupled to a reference potential.

6. The integrated circuit of claim 1, wherein the integrated circuit comprises a read out integrated circuit configured to receive a signal from a focal plane array.

7. The integrated circuit of claim 1, further comprising a source follower and a row select switch, wherein the source follower includes a first terminal coupled to the third terminal of the input device, a second terminal coupled to a reference voltage and a third terminal coupled to a first terminal of the row select switch, wherein the row select switch has a second terminal coupled to a focal plane array, and wherein the row select switch is configured to selectively read data from one of a plurality of rows of the focal plane array.

8. A method for transitioning an integrated circuit between a first mode and a second mode, the method comprising:

generating a detection current on a detection signal path of the integrated circuit in response to a received signal, wherein the integrated circuit includes:

an operational amplifier having a first input and a second input, wherein the second input is coupled to a feedback signal path;

a switching network having a first switch and a second switch, wherein the first switch is coupled between an output of the operational amplifier and the feedback signal path and the second switch is coupled between the detection signal path and the feedback signal path; and an input device having a first terminal coupled to an output of the operational amplifier, a second terminal coupled to the detection signal path to receive the detection current, and a third terminal, wherein the input device comprises a switching device and the first terminal of the input device comprises a gate terminal, wherein the output of the operational amplifier determines a conductive state of the input device in the first and second modes, and generating a control signal for the switching network in response to a level of the detection current;

transitioning the integrated circuit between the first mode and the second mode in response to the control signal, wherein the first mode is a direct injection (DI) mode and the second mode is a buffered direct injection (BDI) mode, and wherein during DI mode, closing the first switch and opening the second switch such that the output of the operational amplifier is coupled to the second input of the operational amplifier, and during BDI mode, opening the first switch and closing the second switch such that the second terminal of the input device is coupled to the second input of the operational amplifier, wherein the detection path includes a photodiode coupled to the second terminal of the input device, wherein the photodiode is configured to detect an infrared signal and generate the detector current responsive to the infrared signal, and employing a sample and hold module having a sample and hold switch and a capacitor, wherein the sample and hold switch has a first terminal coupled to the third terminal of the input device and a second terminal coupled to a first terminal of the capacitor, and the capacitor has a second terminal coupled to a reference potential.

9. The method of claim 8, further comprising transitioning the integrated circuit to the first mode when the level of the detection current is greater than the current threshold and transitioning the integrated circuit to the second mode when the level of the detection current is less than the current threshold.

10. The method of claim 8, further comprising receiving a detection bias voltage signal at the first input of the operational amplifier.

11. The method of claim 8, further comprising coupling a first terminal of a reset switch to the third terminal of the input device and coupling a second terminal of the reset switch to a reference potential.

12. The method of claim 8, further comprising receiving the signal at a focal plane array of the integrated circuit, wherein the integrated circuit is a read out integrated circuit.

13. The method of claim 8, further comprising coupling a first terminal of a source follower to the third terminal of the input device, coupling a second terminal of the source follower to a reference voltage, coupling a third terminal of the source follower to a first terminal of a row select switch, and coupling a second terminal of the row select switch to a focal plane array, wherein the row select switch is configured to selectively read data from one of a plurality of rows of the focal plane array.

* * * * *